Jan. 13, 1959 G. A. GAGNON 2,867,810

ELECTRONIC COMPONENT ATTACHING HEAD

Filed Oct. 9, 1956 3 Sheets-Sheet 1

INVENTOR.
George A. Gagnon
BY J. D. Douglas
HIS ATTORNEY

Jan. 13, 1959 G. A. GAGNON 2,867,810

ELECTRONIC COMPONENT ATTACHING HEAD

Filed Oct. 9, 1956 3 Sheets-Sheet 2

INVENTOR.
George A. Gagnon

BY

J. D. Douglas

HIS ATTORNEY

Jan. 13, 1959 G. A. GAGNON 2,867,810

ELECTRONIC COMPONENT ATTACHING HEAD

Filed Oct. 9, 1956 3 Sheets-Sheet 3

INVENTOR.
George A. Gagnon
BY
J. D. Douglas
HIS ATTORNEY

United States Patent Office 2,867,810

Patented Jan. 13, 1959

2,867,810

ELECTRONIC COMPONENT ATTACHING HEAD

George A. Gagnon, Wilmette, Ill., assignor to Admiral Corporation, Chicago, Ill., a corporation of Delaware Application October 9, 1956, Serial No. 614,868

13 Claims. (Cl. 1—220)

This invention relates to improvements in apparatus for incorporating electronic circuit components in an electronic circuit such as employed in radio or television receivers, although the apparatus is not limited to radio or television receiver manufacture.

More specifically, the invention contemplates mechanism for attaching circuit components to a printed circuit board or blank, the blank being a plate of some non-conducting material on one side of which conductors are formed by any one of a number of processes. The attaching process is carried out by the novel apparatus prior to soldering of the components to the conductor portions of the blank.

In the radio and television industry particularly, it is frequently necessary to shift from manufacture of one model of receiver to another, and, where printed circuits are employed in the receivers, to consequently employ printed circuit blanks differing from the ones used before the change, the change usually including differences in arrangement of the apertures, in the blanks, through which leads on the components are passed. When the electronic apparatus is manufactured on a production basis, the change involved changes in automatic equipment and this, in turn, involved either new dies or parts for rearrangement of the old ones, or both new dies and parts for their support. Therefore, the matter of shifting from the operation of attaching components to one style of blank to another blank on an assembly line was costly and time-consuming. Furthermore, the older use of dies to clinch the component leads to the blanks was often responsible for a comparatively loose relationship between component and blank, and the operation of connecting the components to a blank was accompanied by vibration from impact when appropriate apparatus was operated for forcing the leads against the dies.

Due to the present invention, few or no new parts are called for in production line equipment in order that a new printed circuit blank may be provided with its components. The use of fixed dies, for clinching the component leads to the blanks, has been dispensed with and it is not longer necessary for inserting apparatus to operate with the previous violence for clinching the leads by forcing them against dies or anvils. Moreover, components fixed to blanks, by the present novel apparatus, are more snugly associated with the blanks since greater surface areas of the leads are intimately associated with conductor portions of the blanks.

In keeping with the present invention, a printed circuit blank is arranged to pass through a horizontal course throughout the length of which are spaced-apart component receiving stations. At each of the stations the blank is detained long enough to receive a component, after which it is moved to the immediately next station to receive another component at a different point on its surface. The components are applied to the blank by a component affixing couple, at least one of which may be at each of the respective stations. Each of the couples consists of an inserting mechanism and a clinching mechanism, the former being above the level of the course and the latter below the course. Both of the mechanisms are supported on separate pivots which are in coaxial relationship to each other. Also, both of the pivots are supported from a horizontal slider movable transversely of the course so that regardless of the position where a pair of holes is located in a blank the component affixing couples may be moved into operative relation to the holes for passing component leads therethrough, after which clamping means in connection with the slider and/or respective mechanisms and their mounting may be tightened to releasably clamp the latter where they are positioned. The leads of a component are adequately long to protrude from the lower side of the blank.

Following extension of the leads below the blank by inserting them through holes in said blank, from above the protruding portions are clinched by power-operated spreaders of the novel clincher mechanism, the spreaders being movable between contracted and extended positions. The blank having been moved into close proximity to the spreaders by operation of the inserting mechanism, the spreaders, in their contracted position extend between protruding portions of the leads. Then the spreaders are moved, in timed relation to operation of the inserting mechanism, to engage the leads and bend them about the edges of the blank at the holes. The spreaders then pass under the bent leads pressing them upward against the lower surface of the blank.

Additional advantages of this invention will be apparent from the following description when considered in conjunction with the accompanying drawings, in which.

Figure 10:
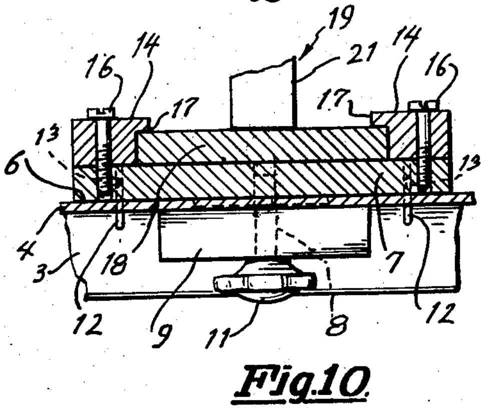
Fig. 10 is a vertical section taken on line 10—10 of Fig. 1.
Figure 4:
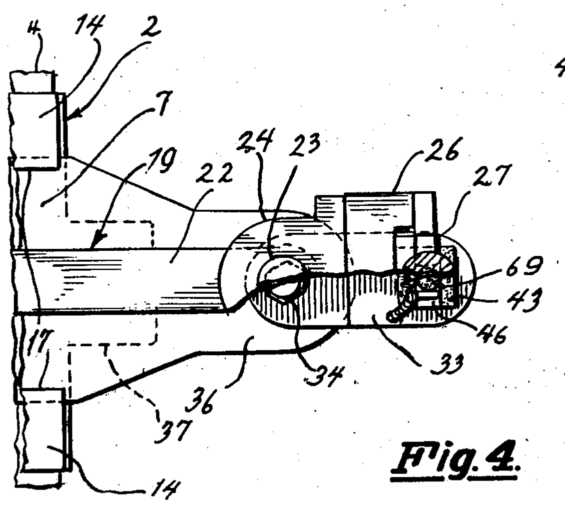
Fig. 4 is a fragmentary horizontal section taken on line 4—4 of Fig. 3, parts being shown broken away.

The reference character 2 is used to denote the frame, in its entirety, of a machine for affixing circuit components to printed circuit blanks indicated by the reference character B. Structurally, the frame 2 includes upper parallel members 3 and 4, preferably angle irons of L-shaped cross-section, which are rigidly joined to each other by means, not shown, to afford horizontal surfaces 6 on which a base, bearer member or rectangular plate 7 is supported. The plate 7 is releasably secured to the members 3 and 4 by screws 8 which pass freely through metal clamp plates 9 and are threaded in the base 7. Additionally, the screws 8 have heads or handles 11 by which they are turned to pinch the edges of members 3 and 4 between the base 7 and plates 9 for clamping of the base 7 to the members 3 and 4. Where they engage the lower surfaces of the members 3 and 4, the plates 9 are relieved to a depth equal to the thickness of the members 3 and 4 to avoid bending of the screws as they are tightened. Structurally, the member 7 is a metal plate of rectangular formation. It bears, adjacent one of its ends, a pair of spaced-part pins or locator members 12 and the member 3 is formed with a pair of holes 13 to receive the pins so that in case the plate 7 is removed from the frame it can be returned to its former position by inserting the pins 12 in the holes 13. The plate 7 bears a pair of guides or guide bars 14, of inverted L-shaped cross-section, each one of which is releasably secured to the base, at opposite sides thereof, Fig. 10, by screws 16. The bars 14 include ledges 17 which extend toward each other so that they may have limited overlapping relation to a slider or slider plate 18 confined between the ledges and base 7. The thickness of the slider is such that when the screws 16 are tightened, the slider 18 is pinched between the ledges 17 and the base 7 and so clamped to the latter. When the screws 16 are loosened slightly, the slider may be slid transversely of the frame 2 to a selected position wherein it may be then secured.

Figure 3:
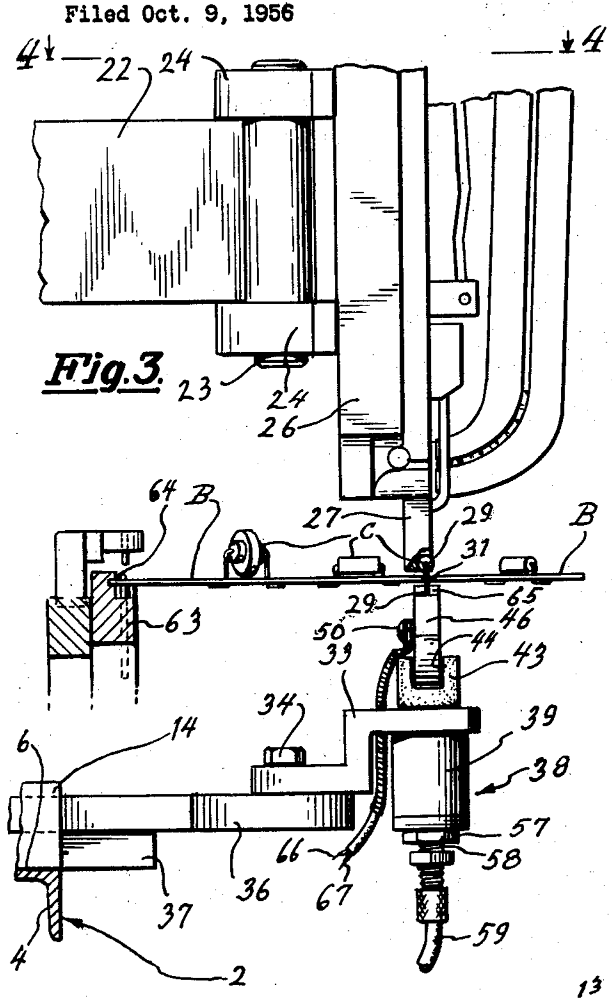
Fig. 3 is also a fragmentary elevational view of the parts shown in Fig. 1, the component affixing couple being in different positions with respect to their Fig. 1 positions.

The slider 18 provides support for a bracket 19 of inverted L-shape. It includes a vertical portion 21, the lower end of which is rigidly fixed to the slider 14, and a horizontal portion 22 to the outer end of which is fixed a vertical pivot shaft 23. Immediately above and below the portion 22, the shaft 23 affords bearing support for a pair of bearings 24 of a component affixing mechanism indicated by the character 26 which will not be described herein since its structure is fully dealt with in my copending application filed September 9, 1955, Serial Number 533,351. It may be timely to say, however, that it includes a vertically movable member 27, Fig. 3, the purpose of which is to carry a circuit component C into engagement with the upper side of the blank B and insert parallel bent portions 28 of leads 29, Fig. 11, on the component into a selected pair of holes 31 in the blank B.

From the slider 18 is also supported a clinching mechanism 32. The support for the mechanism includes an offset arm 33 pivoted by a bolt 34 to a narrowed extension 36 of the slider 18. Beneath the extension 36 the base 7 is formed with an ear 37 as additional support for that portion of the slider 18 which extends outward to the right of the frame 2, Fig. 1.

Figures 5, 6, 7, 8, 9:
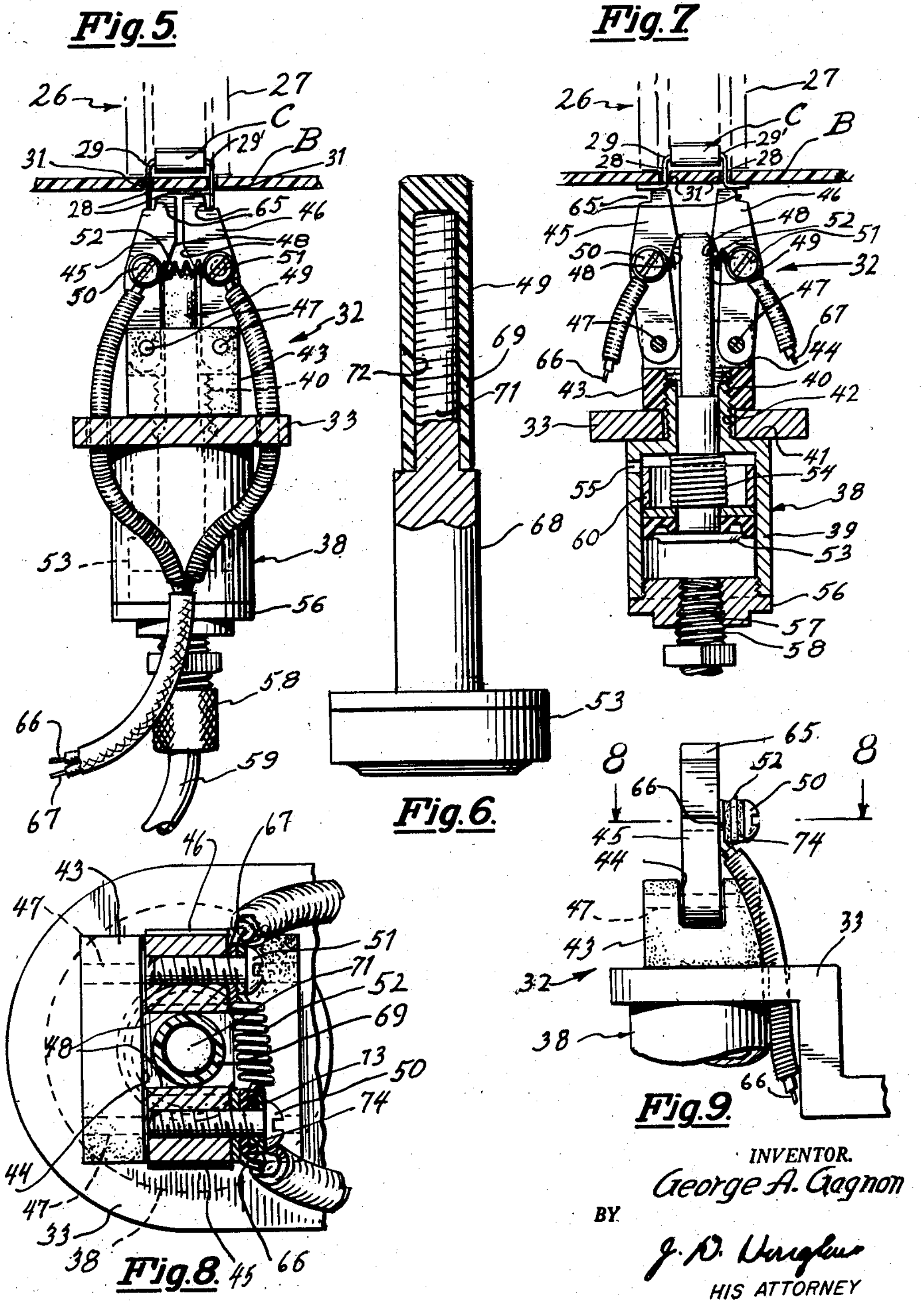
Fig. 5 is a vertical section of the clincher mechanism and associated parts, the section being taken on line 5—5 of Fig. 2.
Fig. 6 is an elevational view of the motor piston and piston rod, a portion of the latter being broken away.
Fig. 7 is a view of the mechanism shown in Fig. 5, parts thereof being in a different position.
Fig. 8 is a horizontal section taken on line 8—8 of Fig. 9.
Fig. 9 is a fragmentary elevational view of the parts shown in Fig. 5, the mechanism being viewed at right angles to the direction it is viewed in Fig. 5.

The structure of the clinching mechanism, in detail, is best shown in Fig. 7. Therein it will be noted that the arm 33 supports a fluid pressure motor 38 having a cylinder 39. At the upper end of the cylinder 39 is an externally threaded neck portion 40, extending upward from a shoulder 41, through an aperture 42, in the arm 33, above which the neck bears a nut 43 for pinching the arm between it and the shoulder thereby securing the motor to said arm. The nut 43 is preferably square in horizontal section and upwardly thereof is formed with a transverse slot 44 to receive a pair of spreaders or levers 45 and 46. There are anchored, at their lower ends, in the slot by pivot pins 47. Intermediate their ends, the arms converge upward toward each other to provide, on their adjacent surfaces, a pair of cams 48, one of which is on either side of the axes of a piston rod 49 of the motor 38. One end of a tension spring 52 is hooked around a screw 50 on the arm 45 while the other spring end is hooked around a screw 51 on the lever 46 to bias the levers toward each other.

Normally, the upper end of the rod 49 is below the cams 48, Fig. 5, at which time a piston 53, on the lower end of the rod, is at the lower end of the cylinder 39. The piston is biased toward this position by a compression spring 54 coiled about the rod 49 and confined between the piston and upper end of the cylinder 39. Laterally of its upper end, the cylinder is formed with an exhaust port 55 through which air above the piston is released as the latter is moved upward. The lower end of the cylinder 39 is closed by a head 56 threaded in the cylinder and having an aperture 57 in which a pipe fitting 58 is threaded. Its purpose is to couple a flexible tube 59, from a source of compressed air, to the motor 38.

As the member 27 is operated, in accordance with the disclosure aforesaid, it, of course, bends a pair of the leads 29 and 29′ on the component C into parallel relation to each other thereby providing vertical lead portions 28. During its continued operation the portions 28 are passed through a pair of holes 31 in the blank B. Also, in timed relation to insertion of the portions through the holes 31, below which the portions 28 protrude, air is admitted to the cylinder 39 by way of the hose 59. This causes the piston 53 to move upward, against resistance of the spring 54, carrying with it the rod 49. The latter is thereby forced between the cams 48 causing the arms 46 to be swung about their pivots 47 against resistance of the spring 52. If desired, a stop or sleeve 60 may be slidably mounted in the cylinder above the piston to limit the upward movement of the rod 49.

Figures 1, 2:
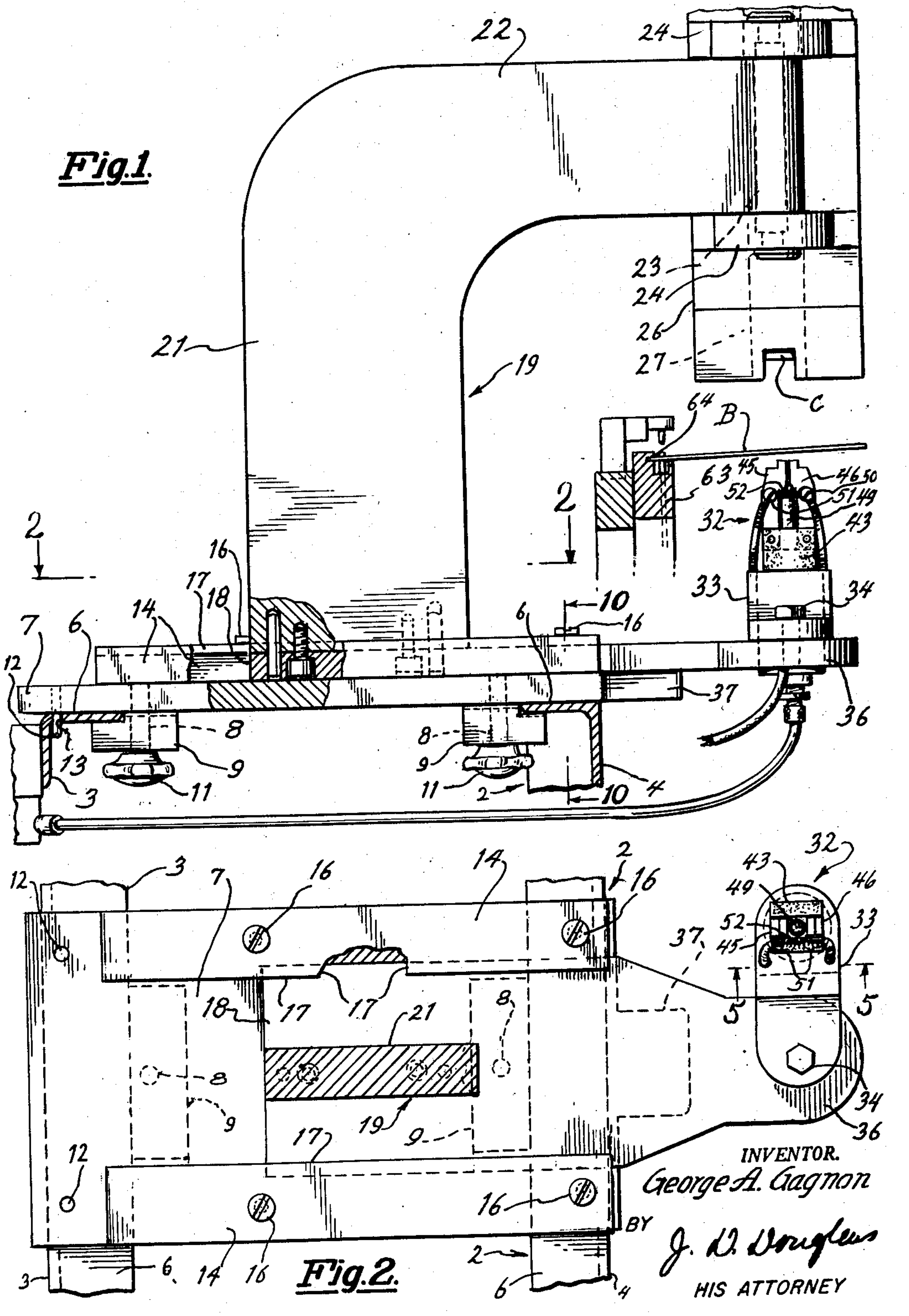
Fig. 1 is a fragmentary, sectional view of printed circuit apparatus of the class in which the invention is incorporated.
Fig. 2 is a horizontal section taken on line 2—2 of Fig. 1, some of the parts having been broken away.

A component clinching mechanism 32, is stationed at predetermined distances in a course beside a horizontal track rail 63, Fig. 1, having a track or lateral groove 64 therein throughout its length. The groove 64 is formed to receive one of the edges of a blank which is releasably anchored in the groove by means described in the application aforesaid. The blank therefore extends outward from the rail 63 along which it is slid, by movement of the anchoring means from a point above one of the pairs of spreaders to a point above the immediately next pair of spreaders. The support for the blank is so formed that during its transit between points over adjacent pairs of spreaders, the blank is inclined upward slightly from the rail 63. This enables the leading edge of a moving blank to clear the spreaders 46 before the mechanism 27 is operated. After it has been carried over one of the mechanisms 32 the mechanism 27 is operated during which it depresses the blank into close proximity to the tips of the spreaders 46. The spreaders are then about 1/32 of an inch from the blank. In this status, the leads 29 are passed into the holes 31 of the blank below which the leads protrude. The arms 45 and 46 are then in closed relation to each other and extend between the protruding portions of the leads. If desirable, the combined width of the arms 45 and 46, at their upper ends, may be reduced as at 65 in order that the leads 29 may straddle the arms as the leads are passed through the blank.

In timed relation to operation of the mechanism 27 the motor 38 is then operated to move the arms 46 outwardly. In so doing, the spreaders first bend the protruding portions of the leads 29 and 29′ about edges of the blank provided by the apertures 31. This bending operation takes place early in the outward movement of the wipers following which, and during their continued movement outward, the tips of the arms 45 and 46 perform a wiping action on the protruding but now bent lead portions. During this wiping operation, the mechanism 27 remains in its downward position to resist a tendency on the part of the arms 46 to lift the blank B.

Although the invention has been described in conjunction with a compressed air motor 38 it is within the purview of the invention to employ other motive means for operating the spreaders 46. For example, a solenoid is also contemplated for moving the rod 49 axially.

As in the application, previously referred to, each of the levers 45 and 46 also performs the function of an electrical conductor of two distinct test circuits in connection with each of which is a device, not shown, to indicate if and which of the leads 59 have failed to be passed through one of the holes 31 or if neither of the leads has been passed through the holes. For such a determination, the screw 50 affords anchorage for an insulated wire 66 while the screw 51 affords anchorage for a second wire 67. When the levers 46 are moving outward in engagement with the protruding leads, a flow of current may take place over the wire 66 to the mechanism 26 by passing through the lever 45 and lead 29. At the same time, current may pass through the wire 67 to the mechanism 26 by way of the arm 46 and lead 29'. Precautions are therefore necessary to electrically insulate the spreaders 45 and 46 from each other. Thus, the nut 43 is made of some suitable electrically non-conductive material, such as Bakelite. The piston rod 49 is of composite construction, as will be noted in Fig. 6. Therein it will be noted that while predominantly metallic, the rod includes an upper section 71, of reduced diameter, over which a cap 69 of some suitable insulating material is placed. The cap 69 is so retained by a suitable adhesive assisted by a knurled or roughened surface on the section 71. The cap 69 terminates short of a lower portion 68 which is slidably journalled in the neck 40. The spreaders are therefore spaced from each other by the insulated part of the piston rod even when the spreaders are in their contracted position, Fig. 5. Although one end of the spring 52 is hooked about the screw 51 and is in electrical communication with the lever 46, the remaining end of the spring is hooked in a peripheral groove 73 of a bushing 74 of some suitable insulation material on the screw 50 to electrically insulate the spring therefrom.

Figure 11:
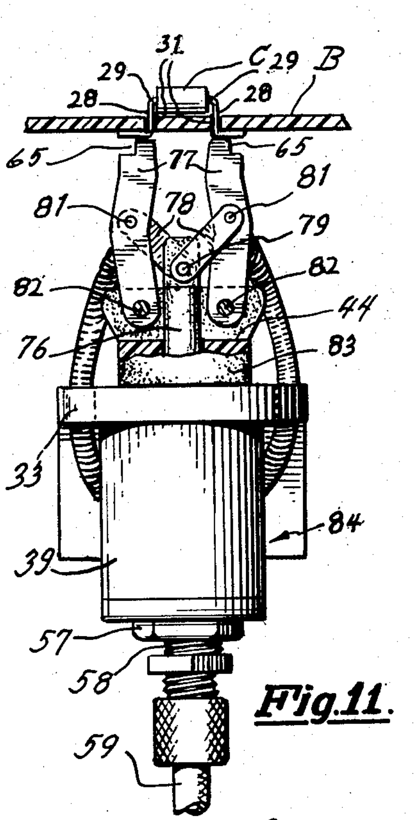
Fig. 11 is an elevational view of a second embodiment of the invention, as viewed from a point beyond the swingable end of its support, portions being shown broken away.

In a second embodiment of the invention, shown in Fig. 11, different means is provided for communicating motion of a piston rod 76 to a pair of spreaders 77 similar to the spreaders 45 and 46. The means includes a pair of toggle links 78 pivotally coupled at 79 to the rod 76 and similarly connected at 81 to the spreaders 77.

Although I have described my invention in different embodiments thereof, I am aware that extensive other departures may be made therefrom without departing from the spirit or scope of the idea.

I claim:

1. Attaching apparatus for coupling a circuit component to the obverse side of a supported printed circuit blank, the component having a pair of leads bent parallel to each other and the blank having apertures therein receiving the leads portions of which extend from the reverse side of said blank comprising a pair of lead spreaders adjacent the reverse side of said blank, said spreaders being mounted to move radially of an axis normal to said reverse side and each having an end associated with said side, a fluid pressure motor having a piston on said axis, cam means, follower means, one of said means being on said spreaders and the other of said means being connected to said piston, and resilient means coupled to said spreaders to bias said cam means and follower means into cooperative engagement with each other thereby for the ends of the spreaders to occupy a contracted position when said piston is in one of its positions when the protruding lead portions may extend on either side of said spreader ends, movement of said piston toward another of its positions moving said spreader ends out of their contracted positions for them to bend said protruding portions about edges of the blank at the apertures therein by first engaging said portions and pressing them outward and then wiping them into intimate association with said blank by passing longitudinally of the bent portions thereby to clinch the leads to said blank.

2. Attaching apparatus for coupling a circuit component having a body and thereon a pair of leads bent into parallelism by component dispensing means above a horizontal course for a printed circuit blank having a pair of apertures receiving the leads and below which the leads protrude, said attaching apparatus comprising a support below the course, said support having an aperture therein, a vertical fluid pressure motor below the support having a vertically reciprocable piston rod and a bearing for the piston rod at its upper end, said bearing extending up through the aperture in the support, a clamping member on the bearing above said support to clamp the motor thereto, a pair of spreader elements pivotally mounted on the support at opposite sides of the rod for movement about horizontal axes, said elements having upper ends which are movable arcuately toward and away from each other in close proximity to the bottom of said blank, and means coupled to the spreaders for drivingly associating them with said rod whereby said upper ends are positioned toward each other between the protruding leads when said rod is at the lower end of its stroke and for said ends to be moved away from each other by movement of said rod upward to engage the leads and first bend them outward about the outer edges of said apertures in the blank and then wiping the deflected leads against the bottom of said blank to clinch them to said blank.

3. In a printed circuit apparatus comprising a horizontal track from which a printed circuit blank having a pair of apertures therein may be cantilevered in a course over which inserting means is stationed for concurrently engaging parallel leads of a circuit component to insert them into the apertures of the blank below the lower side of which said leads protrude, in combination, spreader support means below the course, a pair of metallic spreaders mounted on said support means for movement between contracted and expanded positions, means biasing the spreaders to their contracted position for them to extend between the leads when the latter protrude down below the blank, means insulating the spreaders from their supports and from each other, means insulating said biasing means from at least one of said spreaders so that each of said spreaders may be placed separate electrical circuits to allow flow of currents therethrough to the inserting means when said spreaders engage the leads on moving toward their expanded positions to clinch said leads to the blank by bending them about edges of the apertures, so that when currents flow through both circuits separately indicators will be actuated to indicate whether the leads have been inserted in the apertures when said inserting means is operated.

4. Mechanism for attaching a circuit component to a printed circuit blank, the component having a pair of substantially parallel leads and the blank having therein spaced apertures receiving the leads and beyond which the leads protrude at one side of the blank, said apparatus comprising a rod at said one side of the blank mounted for reciprocation toward and away from the blank substantially perpendicular to the blank, a pair of arms at said one side of the blank pivotally mounted on parallel axes which extend substantially perpendicular to the axis of reciprocation of said rod, said pivotal axes for the arms being disposed respectively on opposite sides of the axis of reciprocation of the rod, said arms extending away from their respective pivotal axes toward the blank and terminating in outer ends remote from their respective pivotal axes which are movable arcuately toward and away from each other across the blank in close proximity to said one side of the blank, said outer ends of the arms when positioned close to each other being disposed between the protruding leads at said one side of the blank, and means on said rod and said arms for applying force against the arms between their respective pivotal axes and their outer ends to move the outer ends of the arms away from each other laterally outward arcuately across one side of the blank to engage the protruding leads and bend said leads laterally outward against the outer edges of the apertures in the blank and to press the bent over leads laterally outward against said one side of the blank in response to movement of the rod in one direction.

5. The mechanism of claim 4, wherein there is provided spring means acting against the arms between their pivotal supports and their outer ends to bias their outer ends toward each other.

6. The mechanism of claim 4, wherein the arms have reduced outer ends which receive the protruding leads when the outer ends of the arms are positioned close to each other.

7. Mechanism for attaching a circuit component to a printed circuit blank, the component having a pair of substantially parallel downwardly extending leads and the blank having a pair of apertures through which the leads extend down below the bottom of the blank, said mechanism comprising a rod below the blank mounted for reciprocation vertically toward and away from the blank, a support spaced below the blank and having an opening through which the rod extends up toward the blank, motive power means for moving the rod mounted on said support and extending downward therefrom, a pair of arms pivotally supported from said support for pivotal movement about spaced horizontal axes disposed above the support and below the blank on opposite sides of the reciprocable rod, said arms extending up from their respective pivotal axes and presenting upper ends in close proximity to the bottom of the blank which are movable arcuately toward and away from each other laterally across the bottom of the blank, spring means acting against the arms to position their upper ends toward each other between the downwardly protruding leads on the circuit component, and means on said rod and said arms for effecting movement of the upper ends of the arms laterally outward away from each other to engage the downwardly protruding leads and bend said leads laterally outward against the outer edges of said apertures in the blank and to press the bent over leads against the bottom of the blank in response to upward movement of the rod.

8. The mechanism of claim 7, wherein the arms are cut away at their outer edges at the upper ends to receive the downwardly protruding leads when said upper ends of the arms are positioned toward each other.

9. The mechanism of claim 7, wherein said spring means is a tension spring connected between the arms at locations thereon between their pivotal supports and their upper ends.

10. The mechanism of claim 7, wherein said last-mentioned means comprises cam surfaces on the upper end of the rod and follower surfaces on the inner edges of the arms which are engaged by said cam surfaces on the rod when the rod moves upward to spread the arms apart.

11. The mechanism of claim 7, wherein said last-mentioned means comprises toggle linkage means connected between the rod and the arms to move the arms apart when the rod moves upward.

12. Mechanism for attaching a circuit component to a horizontally disposed printed circuit blank, the component having a pair of leads and the blank having therein apertures through which the component leads protrude down below the bottom of the blank, said mechanism comprising a rod mounted below the blank for vertical reciprocation toward and away from the bottom of the blank, a pair of spreader arms pivotally mounted at their lower ends on horizontal axes disposed below the blank and on opposite sides of said vertically reciprocable rod, said arms extending up from their respective pivotal axes and terminating in free upper ends which are movable arcuately toward and away from each other across the bottom of the blank in close proximity to the bottom of the blank, said upper ends of the arms when positioned close to each other being disposed between the downwardly protruding component leads below the blank, and means on said rod and said arms for applying force against the arms between their respective pivotal axes and their upper ends to pivot the arms apart and move their upper ends away from each other laterally outward arcuately across the bottom of the blank to engage the downwardly protruding leads and bend said leads laterally outward against the outer edges of the apertures in the blank and to press the bent over leads laterally outward against the bottom of the blank when the rod moves up toward the blank.

13. The mechanism of claim 12, wherein there is provided spring means acting against the arms between their pivotal axes and their upper ends to bias their upper ends toward each other.

References Cited in the file of this patent

UNITED STATES PATENTS

| | | |
|---|---|---|
| 1,048,136 | Davis | Dec. 24, 1912 |
| 1,553,774 | Heighton | Sept. 15, 1925 |
| 2,173,390 | Burns | Sept. 19, 1939 |
| 2,186,569 | Bacon | Jan. 9, 1940 |
| 2,226,916 | Zeruneith | Dec. 31, 1940 |
| 2,605,467 | Lind | Aug. 5, 1952 |
| 2,746,041 | Heeley | May 22, 1956 |
| 2,758,303 | Dow | Aug. 14, 1956 |
| 2,772,416 | Dorosz | Dec. 4, 1956 |